(12) United States Patent
Na et al.

(10) Patent No.: US 9,349,637 B2
(45) Date of Patent: May 24, 2016

(54) METHOD FOR VOID-FREE COBALT GAP FILL

(71) Applicant: Lam Research Corporation, Fremont, CA (US)

(72) Inventors: Jeong-Seok Na, San Jose, CA (US); Tianhua Yu, San Jose, CA (US); Michal Danek, Cupertino, CA (US); Sanjay Gopinath, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 14/465,610

(22) Filed: Aug. 21, 2014

(65) Prior Publication Data

US 2016/0056074 A1 Feb. 25, 2016

(51) Int. Cl.
| | |
|---|---|
| *H01L 21/3205* | (2006.01) |
| *H01L 21/768* | (2006.01) |
| *H01L 21/326* | (2006.01) |
| *C23C 16/52* | (2006.01) |
| *C23C 16/50* | (2006.01) |
| *C23C 16/455* | (2006.01) |
| *H01J 37/32* | (2006.01) |

(52) U.S. Cl.
CPC .... *H01L 21/76876* (2013.01); *C23C 16/45544* (2013.01); *C23C 16/50* (2013.01); *C23C 16/52* (2013.01); *H01J 37/32009* (2013.01); *H01J 37/32449* (2013.01); *H01L 21/326* (2013.01); *H01L 21/32051* (2013.01); *H01L 21/76879* (2013.01)

(58) Field of Classification Search
CPC ................................................ H01L 21/76876
USPC .......................................................... 438/586
See application file for complete search history.

(56) References Cited

U.S. PATENT DOCUMENTS

| | | | |
|---|---|---|---|
| 4,714,520 | A | 12/1987 | Gwozdz |
| 4,746,375 | A | 5/1988 | Iacovangelo |
| 5,250,467 | A | 10/1993 | Somekh et al. |
| 5,370,739 | A | 12/1994 | Foster et al. |
| 5,391,394 | A | 2/1995 | Hansen |

(Continued)

FOREIGN PATENT DOCUMENTS

KR    10-2010-0067065    6/2010

OTHER PUBLICATIONS

U.S. Appl. No. 14/873,152, filed Oct. 1, 2015, entitled "Method for Void-Free Cobalt Gap Fill."

(Continued)

*Primary Examiner* — Anthony Ho
(74) *Attorney, Agent, or Firm* — Weaver Austin Villeneuve & Sampson LLP

(57) ABSTRACT

Provided herein are methods of depositing void-free cobalt into features with high aspect ratios. Methods involve (a) partially filling a feature with cobalt, (b) exposing the feature to a plasma generated from nitrogen-containing gas to selectively inhibit cobalt nucleation on surfaces near or at the top of the feature, optionally repeating (a) and (b), and depositing bulk cobalt into the feature by chemical vapor deposition. Methods may also involve exposing a feature including a barrier layer to a plasma generated from nitrogen-containing gas to selectively inhibit cobalt nucleation. The methods may be performed at low temperatures less than about 400° C. using cobalt-containing precursors.

18 Claims, 10 Drawing Sheets

(56) References Cited

U.S. PATENT DOCUMENTS

| | | | |
|---|---|---|---|
| 5,489,552 | A | 2/1996 | Merchant et al. |
| 5,719,410 | A | 2/1998 | Suehiro et al. |
| 5,804,249 | A | 9/1998 | Sukharev et al. |
| 5,866,483 | A | 2/1999 | Shiau et al. |
| 5,963,833 | A | 10/1999 | Thakur |
| 6,001,729 | A | 12/1999 | Shinriki et al. |
| 6,017,818 | A | 1/2000 | Lu |
| 6,034,419 | A | 3/2000 | Nicholls et al. |
| 6,037,263 | A | 3/2000 | Chang |
| 6,066,366 | A | 5/2000 | Berenbaum et al. |
| 6,100,193 | A | 8/2000 | Suehiro et al. |
| 6,107,200 | A | 8/2000 | Takagi et al. |
| 6,143,082 | A | 11/2000 | McInerney et al. |
| 6,184,158 | B1 | 2/2001 | Shufflebotham et al. |
| 6,355,558 | B1 | 3/2002 | Dixit et al. |
| 6,432,830 | B1 | 8/2002 | Merry |
| 6,566,250 | B1 | 5/2003 | Tu et al. |
| 6,696,337 | B2 | 2/2004 | Asano et al. |
| 6,861,356 | B2 | 3/2005 | Matsuse et al. |
| 6,902,763 | B1 | 6/2005 | Elers et al. |
| 6,903,016 | B2 | 6/2005 | Cohen |
| 7,005,372 | B2 | 2/2006 | Levy et al. |
| 7,141,494 | B2 | 11/2006 | Lee et al. |
| 7,355,254 | B2 | 4/2008 | Datta et al. |
| 7,501,343 | B2 | 3/2009 | Byun et al. |
| 7,501,344 | B2 | 3/2009 | Byun et al. |
| 7,655,567 | B1 | 2/2010 | Gao et al. |
| 7,691,749 | B2 | 4/2010 | Levy et al. |
| 7,858,510 | B1 | 12/2010 | Banerji et al. |
| 8,119,527 | B1 | 2/2012 | Chandrashekar et al. |
| 8,124,531 | B2 | 2/2012 | Chandrashekar et al. |
| 8,258,057 | B2 | 9/2012 | Kuhn et al. |
| 8,435,894 | B2 | 5/2013 | Chandrashekar et al. |
| 8,551,885 | B2 | 10/2013 | Chen et al. |
| 8,586,473 | B1 | 11/2013 | Tanwar et al. |
| 8,835,317 | B2 | 9/2014 | Chandrashekar et al. |
| 8,853,080 | B2 | 10/2014 | Guan et al. |
| 8,975,184 | B2 | 3/2015 | Chen et al. |
| 9,153,482 | B2 | 10/2015 | Knisley et al. |
| 2001/0044041 | A1 | 11/2001 | Badding et al. |
| 2002/0037630 | A1 | 3/2002 | Agarwal et al. |
| 2002/0155722 | A1 | 10/2002 | Satta et al. |
| 2002/0177316 | A1 | 11/2002 | Miller et al. |
| 2003/0082902 | A1 | 5/2003 | Fukui et al. |
| 2003/0091870 | A1 | 5/2003 | Bhowmik et al. |
| 2003/0129828 | A1 | 7/2003 | Cohen et al. |
| 2004/0079632 | A1 | 4/2004 | Ahmad et al. |
| 2004/0142557 | A1 | 7/2004 | Levy et al. |
| 2004/0206267 | A1 | 10/2004 | Sambasivan et al. |
| 2004/0245091 | A1 | 12/2004 | Karim et al. |
| 2005/0031786 | A1 | 2/2005 | Lee et al. |
| 2005/0059236 | A1 | 3/2005 | Nishida et al. |
| 2006/0094238 | A1 | 5/2006 | Levy et al. |
| 2006/0145190 | A1 | 7/2006 | Salzman et al. |
| 2007/0099420 | A1 | 5/2007 | Dominquez et al. |
| 2007/0166989 | A1* | 7/2007 | Fresco ............... B82Y 30/00 438/597 |
| 2009/0045517 | A1 | 2/2009 | Sugiura et al. |
| 2009/0053426 | A1 | 2/2009 | Lu et al. |
| 2009/0160030 | A1 | 6/2009 | Tuttle |
| 2009/0269507 | A1 | 10/2009 | Yu et al. |
| 2009/0315154 | A1 | 12/2009 | Kirby et al. |
| 2010/0055904 | A1 | 3/2010 | Chen et al. |
| 2011/0111533 | A1 | 5/2011 | Varadarajan et al. |
| 2011/0159690 | A1 | 6/2011 | Chandrashekar et al. |
| 2011/0236594 | A1 | 9/2011 | Haverkamp et al. |
| 2012/0009785 | A1 | 1/2012 | Chandrashekar et al. |
| 2012/0115329 | A1 | 5/2012 | Chandrashekar et al. |
| 2012/0177845 | A1 | 7/2012 | Odedra et al. |
| 2012/0294874 | A1 | 11/2012 | Macary et al. |
| 2013/0171822 | A1 | 7/2013 | Chandrashekar et al. |
| 2013/0260555 | A1 | 10/2013 | Zope et al. |
| 2013/0302980 | A1 | 11/2013 | Chandrashekar et al. |
| 2013/0330926 | A1 | 12/2013 | Chandrashekar et al. |
| 2014/0030889 | A1 | 1/2014 | Chen et al. |
| 2014/0073135 | A1 | 3/2014 | Guan et al. |
| 2014/0106083 | A1 | 4/2014 | Wu et al. |
| 2014/0349477 | A1 | 11/2014 | Chandrashekar et al. |
| 2015/0024592 | A1 | 1/2015 | Chandrashekar et al. |
| 2015/0056803 | A1 | 2/2015 | Chandrashekar et al. |
| 2015/0221542 | A1 | 8/2015 | Knisley et al. |

OTHER PUBLICATIONS

US Notice of Allowance dated May 29, 2015 issued U.S. Appl. No. 14/171,483.

Hesemann et al., (2000) "The Effect of Film Thickness on Stress and Transformation Behavior in Cobalt Thin Films," *Mat. Res. Soc. Symp. Proc.*, 594:219-224.

Kakuhara, et al.,(2010) "Comparison of Lifetime Improvements in Electromigration between Ti Barrier Metal and Chemical Vapor Deposition Co Capping," *Japanese Journal of Applied Physics*, 49:04DB08, 1-5 pages.

Nogami et al., (2010) "CVD Co and its Application to Cu Damascene Interconnections," *Proceedings of the IITC, IEEE*, 3 pages.

Simone et al., (2013) "Electromigration Comparison of Selective CVD Cobalt Capping with PVD Ta(N) and CVD Cobalt Liners on 22nm-Groundrule Dual-Damascene Cu Interconnects," *Reliability Physics Symposium (IRPS), IEEE International*, p. 3F.4.1-3F.4.6; 6 pages.

Yang, et al., (Jul. 2010) "Characterization of Selectively Deposited Cobalt Capping Layers: Selectivity and Electromigration Resistance", *IEEE Electron Device Letters*, 31(7):728-730.

Yang et al., (2011) "CVD Co Capping Layers for Cu/Low-k Interconnects: Cu EM enhancement vs. Co thickness," *International Interconnect Technology Conference (IITC), IEEE International*, 3 pages.

U.S. Appl. No. 14/866,621, filed Sep. 25, 2015, entitled "Feature Fill With Nucleation Inhibition."

\* cited by examiner

FIG. 1A  FIG. 1B

METHOD FOR VOID-FREE COBALT GAP FILL

BACKGROUND

Semiconductor device fabrication often involves deposition of tungsten-containing materials to be used for horizontal interconnects, vias between adjacent metal layers, and contacts between first metal layers and devices on the silicon substrate. In a conventional deposition process, tungsten is deposited in a chemical vapor deposition (CVD) process by exposing the substrate to a tungsten-containing precursor and a reducing agent.

However, as devices shrink, features become narrower and aspect ratios increase dramatically resulting in various challenges in depositing tungsten. As a result, alternative materials are sought to fill features.

SUMMARY

Provided herein are methods of depositing cobalt films. One aspect involves a method of processing a semiconductor substrates by (a) providing a substrate having one or more features, each feature including a feature opening; (b) selectively inhibiting cobalt nucleation on surfaces of the one or more features that are at or near the feature openings such that there is a differential inhibition profile in each feature; and (c) depositing cobalt in the feature in accordance with the differential inhibition profile. The method may be performed at a temperature less than about 400° C.

In some embodiments, the method further includes, prior to selectively inhibiting cobalt nucleation, depositing a barrier layer on the features. In some embodiments, the barrier layer is selected from the group consisting of titanium nitride, tungsten nitride, and cobalt nitride.

In some embodiments, the method further includes, prior to selectively inhibiting cobalt nucleation, exposing the substrate to a cobalt-containing precursor to partially fill the one or more features.

In some embodiments, the cobalt-containing precursor is selected from the group consisting of dicarbonyl cyclopentadienyl cobalt, cobalt carbonyl, various cobalt amidinate precursors, cobalt diazadienyl complexes, cobalt amidinate/guanidinate precursors, and combinations thereof.

In various embodiments, the surfaces of the features that are at or near the feature openings include the top about 10% to about 50% of the feature sidewalls. In some embodiments, selectively inhibiting cobalt nucleation further includes exposing the substrate to plasma generated from nitrogen-containing gas. The substrate may be exposed to the plasma generated from the nitrogen-containing gas for a time less than about 300 seconds. In some embodiments, the plasma is directional.

In various embodiments, the features include re-entrant profiles. In some embodiments, depositing cobalt in (c) includes exposing the substrate to a cobalt-containing precursor and a reducing agent. In some embodiments, (c) is performed by chemical vapor deposition. The feature opening may be less than about 3×nm and the feature may include an aspect ratio of at least about 1.5:1.

Another aspect involves a method of processing a semiconductor substrate by (a) providing a substrate including one or more features, each feature including a feature opening; (b) exposing the substrate to a cobalt-containing precursor to partially fill the features; (c) exposing the substrate to a nitrogen-containing gas and a plasma; (d) optionally repeating (b) and (c); and (e) depositing cobalt in the feature in accordance with the differential inhibition profile. In some embodiments, the method is performed at a temperature less than about 400° C.

In some embodiments, the cobalt-containing precursor is selected from the group consisting of dicarbonyl cyclopentadienyl cobalt, cobalt carbonyl, various cobalt amidinate precursors, cobalt diazadienyl complexes, cobalt amidinate/guanidinate precursors, and combinations thereof.

In various embodiments, the surfaces of the features that are at or near the feature openings include the top about 10% to about 50% of the feature sidewalls.

Another aspect involves an apparatus for processing semiconductor substrates including one or more process chambers; one or more gas inlets into the process chambers and associated flow-control hardware; a directional plasma generator; and a controller having at least one processor and a memory, such that the at least one processer and the memory are communicatively connected with one another, the at least one processor is at least operatively connected with the flow-control hardware and plasma generator, and the memory stores computer-executable instructions for: (a) introducing a cobalt-containing precursor and reducing agent to the chamber, (b) igniting the plasma and introducing a nitrogen-containing gas to the chamber, (c) optionally repeating (a) and (b), and (d) introducing the cobalt-containing precursor and the reducing agent to the chamber to form a cobalt film, where the substrates include features having re-entrant profiles. In some embodiments, the plasma power is between about 50 W and about 5000 W.

These and other aspects are described further below with reference to the drawings.

BRIEF DESCRIPTION OF THE DRAWINGS

FIGS. 1A-1C are schematic illustrations of cobalt fill in features.

DETAILED DESCRIPTION

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

In semiconductor fabrication, features may be filled with conductive materials. For example, tungsten is often filled in features to form contacts, such as in front end of line (FEOL) applications.

However, as devices shrink, aspect ratios increase and smaller features are used to form contacts. In many applications, an alternative conductive material, such as cobalt, may be used to form contacts or otherwise fill features.

Conventional cobalt deposition in semiconductor fabrication includes electroplating. In cobalt electroplating, some thickness of the metal is first deposited in the feature such that the metal is sufficiently conductive, which permits a current to allow growth of the metal in the feature in the electroplating process. Such seed layers may have a certain maximum resistance. Wet-based cobalt feature fill processes such as electroplating typically involve feature fill in a different tool than the deposition of the seed layer, increasing the complexity of the process and the manufacturing cost.

Cobalt may also be deposited by atomic layer deposition (ALD) or chemical vapor deposition (CVD). In conventional ALD or CVD, voids may form in the features due to the feature profile. FIG. 1A is a schematic illustration of an example of such a feature 100 in a substrate 102. The substrate may be a silicon wafer, e.g., 200-mm wafer, 300-mm wafer, 450-mm wafer, including wafers having one or more layers of material such as dielectric, conducting, or semiconducting material deposited thereon. Features can be characterized by one or more of narrow and/or re-entrant openings, constrictions within the feature, and high aspect ratios. In some embodiments, the feature 100 may have an aspect ratio of at least about 2:1, at least about 10:1, at least about 15:1, at least about 20:1 or higher. The feature hole as shown may also have a dimension near the opening, e.g., an opening diameter or line width, or opening width, or critical dimension, of less than about 19 nm, also known as feature widths less than 1×nm. The feature 100 can be referred to as an unfilled feature or simply a feature. The feature, and any feature, may be characterized in part by an axis that extends through the length of the feature, with vertically-oriented features having vertical axes and horizontally-oriented features having horizontal axes.

Figure 1C:
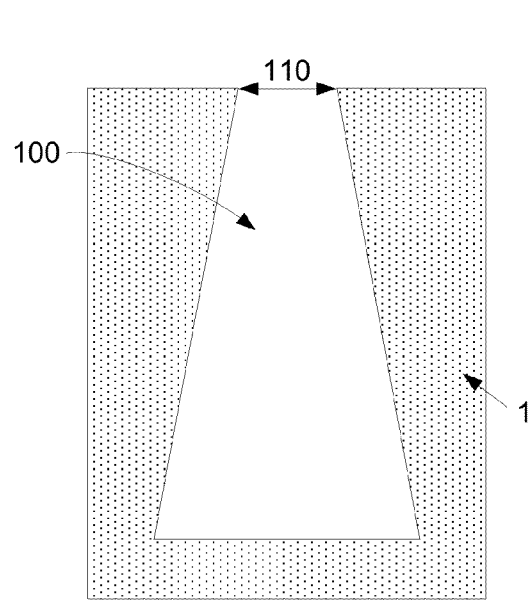
Figure 1C:
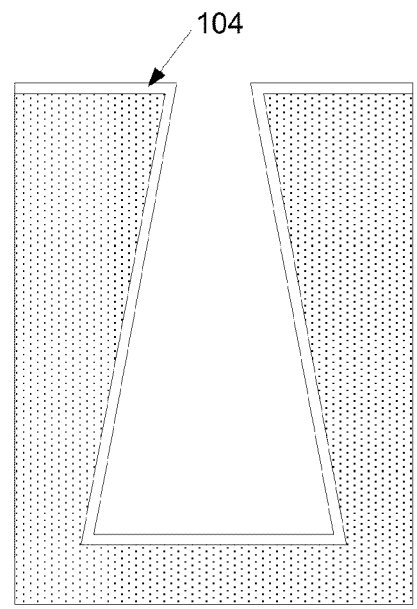
Figure 1C:
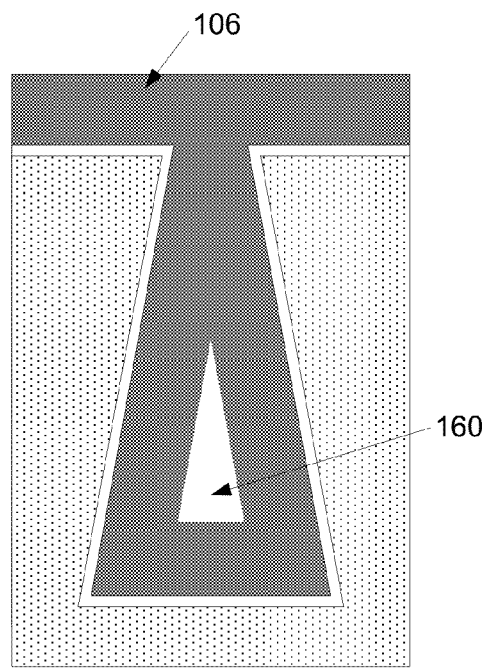

As shown, the substrate 102 includes a feature 100 having a feature opening 110 which is narrower than the width of the bottom of the feature. The feature 100 in FIG. 1A includes a re-entrant profile. A re-entrant profile is a profile that narrows from a bottom, closed end, or interior of the feature to the feature opening. According to various embodiments, the profile may narrow gradually and/or include an overhang at the feature opening. The re-entrant pattern shown in FIG. 1A may be generated by asymmetric etching kinetics during patterning and/or the overhang due to non-conformal film step coverage in the previous film deposition, such as deposition of a diffusion barrier. In various examples, the feature may have a width smaller in the opening at the top of the feature than the width of the bottom of the feature. FIG. 1B is a schematic illustration of a barrier layer 104 deposited conformally into the feature 100. After a barrier layer 104 is deposited, conventional deposition of cobalt by ALD or CVD forms a conformal cobalt film in the feature 100. FIG. 1C is a schematic illustration of the feature 100 filled with cobalt 106 by conventional ALD or CVD methods. Due to the conformal step coverage, the cobalt film 106 has a pinch-off in the re-entrant pattern entrance and results in the formation of a void 160 within the pattern of the feature 100. The cobalt pinch-off may occur on the re-entrant pattern even prior to cobalt gap fill, thereby closing the feature 100 and forming a void 160. A void is region in the feature that is left unfilled. A void can form, for example, when the deposited material forms a pinch point within the feature, sealing off an unfilled space within the feature preventing reactant entry and deposition. The formation of voids in features often results in device failure.

Provided herein are methods of depositing void-free cobalt in both small and large features, including features having a large aspect ratio, performed by a passivation treatment. The approaches described herein are applicable to narrowly patterned substrates with re-entrant structures and/or overhangs that may occur from a prior film deposition or etching. The methods involve using a treatment to selectively inhibit cobalt film growth in some aspects of the cobalt surface to shape the cobalt film growth profile based on cobalt film growth kinetics for treated and non-treated cobalt surfaces. Treated surfaces exhibit longer nucleation delays, which allow growth from untreated surfaces in a bottom-up fill process. Such methods may be applicable to the fabrication of metal gate/contact fill in front end of line (FEOL) processes as well as via/line fill in back end of line (BEOL) processes. Overall, deposition techniques described herein result in void-free cobalt-filled features.

Methods include filling features using a single treatment, or using multiple cycles of treatment. A single treatment method may be used for smaller features, such as features having an opening on the order of less than about 3×nm or less than about 1×nm (e.g., less than about 19 nm) wide. In various embodiments, a single treatment method is used to deposit cobalt in features having an aspect ratio of at least about 1.5:1 or more, or about 10:1 or more. A multiple treatment method may be used for larger features, such as those having an opening on the order of more than about 2×nm, 3×nm, or 4×nm. In multiple treatments, each cycle decreases the remaining opening of the feature until the last cycle. Embodiments are disclosed with respect to the drawings.

Figure 2:
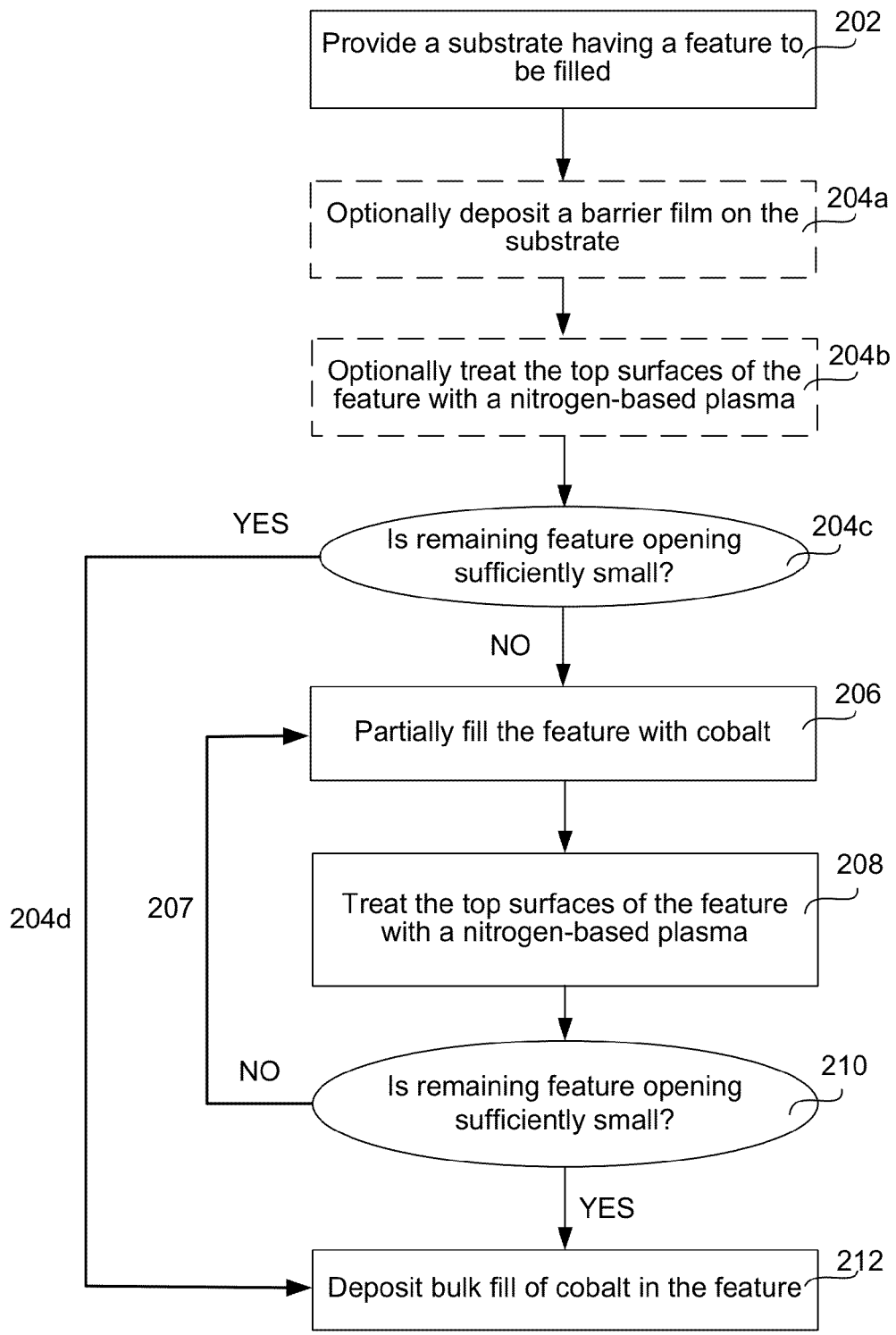
FIG. 2 is a process flow diagram depicting a method in accordance with disclosed embodiments.

FIG. 2 is a process flow diagram of operations for performing methods in accordance with disclosed embodiments. In operation 202, a substrate having a feature to be filled is provided. The substrate may be a silicon substrate or another suitable semiconductor substrate. The substrate may include more than one feature, and may include a pattern of features having features of various sizes, or features of one size. For purposes of this description, FIG. 2 is discussed in the context of filling a single feature, but it should be understood that features of various sizes may also be filled similarly. Features may be any of those described above.

Figure 3A:
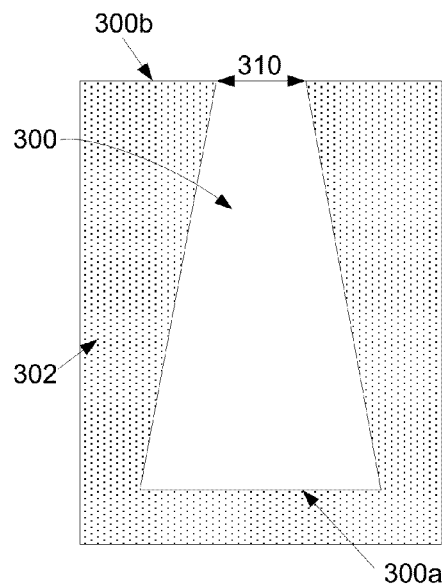
FIGS. 3A-3G are schematic illustrations of features filled with cobalt in accordance with disclosed embodiments.

FIG. 3A provides an example of a small feature 300 in a substrate 302. The small feature 300 includes a narrow feature opening 310 at the top 300b of the small feature 300, which is narrower than the bottom 300a of the small feature 300.

Figure 3B:
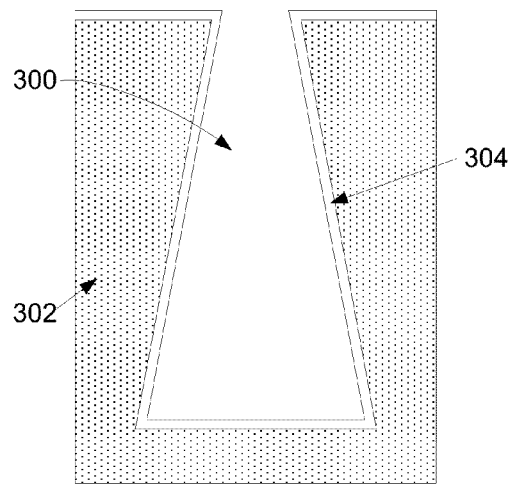

In operation 204a, a barrier film or barrier layer is optionally deposited on the substrate. In various embodiments, the barrier film is deposited conformally. The barrier film may be a thin layer of tungsten nitride (WN), titanium nitride (TiN), or any other suitable barrier film. Additional examples of barrier films include tungsten (W), titanium (Ti), tantalum (Ta), tantalum nitride (TaN), cobalt nitride (CoN), and ruthenium (Ru). In various embodiments, the barrier film is deposited by ALD or CVD methods. The barrier film may be selected such that the barrier film material and cobalt form a strong, high adhesion energy interface. FIG. 3B provides an example of a barrier film 304 deposited in a small feature 300. As shown, the barrier film 304 is deposited conformally in the feature, forming a thin barrier on the substrate 302 along the contours of the feature 300.

In some embodiments, after 204a, the barrier film may be optionally treated with a nitrogen-based plasma in operation 204b. The treatment may be performed to inhibit nucleation cobalt in subsequent operations. For example, the treatment is performed to inhibit bulk cobalt fill in operation 212. In some embodiments, the treatment inhibits bulk cobalt fill in operation 206. Treatment process conditions are further described below with respect to operation 208. In some embodiments, the barrier film is treated if the feature opening is on the order of about 1×nm or smaller.

In operation 204c, it is determined whether the remaining feature opening is sufficiently small. In embodiments having feature openings less than about 1 nm, after a barrier film is deposited in operation 204a and the surface is treated in 204b, the feature opening may be sufficiently small. Considerations for determining whether a feature opening is sufficiently small are described below with respect to operation 210. Generally, if a feature opening is so small that depositing a cobalt seed layer into the feature would narrow the feature opening and prevent or reduce bulk cobalt fill processes, the feature opening is sufficiently small to directly deposit bulk cobalt into the feature in operation 212, as further described below. If the feature is not sufficiently small, then operation 206 is performed.

In operation 206, the feature is partially filled with cobalt at low temperature. In various embodiments, this partial fill may be referred to as a "seed layer." The feature is partially filled by exposing the substrate to a cobalt-containing precursor and a reducing agent. Operation 206 may be performed thermally such that no plasma is generated or introduced to the chamber while cobalt is deposited.

Cobalt may be deposited conformally in the feature by ALD or CVD methods. In a CVD method, the substrate is exposed to a suitable cobalt-containing precursor and a reducing agent to form a cobalt layer on the substrate. The temperature may be between about 70° C. and about 400° C., or between about 80° C. and about 200° C. In some embodiments, the temperature may be between about 70° C. and about 200° C., or between about 100° C. and about 120° C. The chamber pressure may be about 0.1 Torr to about 10 Torr, or between about 1 Torr and about 5 Torr. In some embodiments, the chamber pressure may be between about 0.5 Torr and about 10 Torr, or between about 1 Torr and about 3 Torr. In various embodiments, the suitable cobalt-containing precursor and/or reducing agent are introduced into the chamber using a carrier gas, such as argon (Ar), nitrogen ($N_2$), or carbon monoxide (CO). In some embodiments, the cobalt-containing precursor is introduced to the chamber using argon as a carrier gas. The flow rate of the carrier gas may be between about 10 sccm and about 300 sccm, or between about 10 sccm and about 50 sccm. In some embodiments, the flow rate of the carrier gas may be between about 10 sccm and about 100 sccm, or between about 10 sccm and about 30 sccm. The reducing agent may be any suitable reactant for reducing the selected cobalt-containing precursor. In various embodiments, the reducing agent is hydrogen ($H_2$). The reducing agent may be introduced at a flow rate between about 100 sccm and about 5000 sccm, or between about 2000 sccm and about 5000 sccm. It will be understood that, depending on the particular deposition chamber, flow rates outside of the ranges provided throughout this disclosure may be used.

In an ALD method, the substrate may be exposed in cycles such that the substrate is first exposed to a pulse of a suitable cobalt-containing precursor, then the precursor is purged, then the substrate is exposed to a pulse of a reducing agent, and then the reducing agent is purged, and such cycles may be repeated until a desired thickness of cobalt is formed on the substrate. For a deposition process by ALD, the temperature may be between about 70° C. and about 400° C., or between about 100° C. and about 200° C. In some embodiments, the temperature may be between about 70° C. and about 200° C., or between about 100° C. and about 120° C. The pressure may be between about 1 Torr and about 20 Torr, or between about 8 Torr and about 15 Torr. In various embodiments, the cobalt-containing precursor and/or reducing agent are introduced into the chamber using a carrier gas, such as Ar, $N_2$, or CO. In some embodiments, the cobalt-containing precursor is introduced to the chamber using Ar as a carrier gas. The flow rate of the carrier gas may be between about 10 sccm and about 300 sccm, or between about 10 sccm and about 100 sccm. In some embodiments, the flow rate of the carrier gas may be between about 50 sccm and about 100 sccm. The reducing agent may be any suitable reactant for reducing the selected cobalt-containing precursor. In various embodiments, the reducing agent is $H_2$. The reducing agent may be introduced at a flow rate between about 100 sccm and about 5000 sccm, or between about 2000 sccm and about 5000 sccm. The time when operation 206 is terminated depends on the size of the feature.

Example cobalt-containing precursors include dicarbonyl cyclopentadienyl cobalt (I), cobalt carbonyl, various cobalt amidinate precursors, cobalt diazadienyl complexes, cobalt amidinate/guanidinate precursors, and combinations thereof. Suitable cobalt-containing precursors may include a cobalt center with organic groups and/or carbonyl groups, where organic groups include alkyls, such as methyl, ethyl, propyl, butyl, pentyl, hexyl, heptyl, and octyl, which may be straight or branched hydrocarbon chains. In some embodiments, the organometallic compound has a substituted or unsubstituted allyl ligand. In some embodiments, the allyl ligand is unsubstituted.

In some embodiments the organometallic cobalt compound has the following structure:

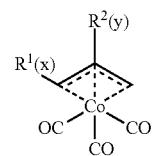

I where $R^1$ is $C_1$-$C_8$-alkyl, $R^2$ is $C_1$-$C_8$ alkyl, x is zero, 1 or 2; and y is zero or 1.

In some embodiments $R^1$ is a $C_2$-$C_8$-alkyl, $R^2$ is independently $C_2$-$C_8$ alkyl.

The term "alkyl" as used herein refers to saturated hydrocarbon chain of 1 to 8 atoms in length, such as methyl, ethyl, propyl, butyl, pentyl, hexyl, heptyl, and octyl. The term "alkyl" includes both straight and branched hydrocarbon chains. Thus, the term propyl includes both n-propyl and isopropyl. The term butyl includes n-butyl, sec-butyl, isobutyl, and tert-butyl.

In some embodiments x is 0 and y is 1. An example of an organometallic compound in accordance with this embodiment is shown below:

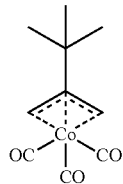

II

Certain described compounds are available from SAFC-Hitech of Haverhill, Mass., in conjunction with corresponding deposition apparatuses available from Lam Research Inc., of Fremont, Calif.

In some embodiments, cobalt-containing precursors include metal-organic precursors having a high vapor pressure at low temperatures, such as at temperatures less than about 100° C. An example vapor pressure may be about 0.5 Torr in an about 30° C. environment. Such precursors are highly selective such that later cobalt deposition is selective to non-treated versus treated surfaces, which are described in detail below. For example, the cobalt-containing precursor may have growth selectivity to generate sufficient nucleation delay on treated surfaces compared to untreated surfaces as described below. For example, the nucleation delay may be greater than about 200 seconds.

Figure 3C:
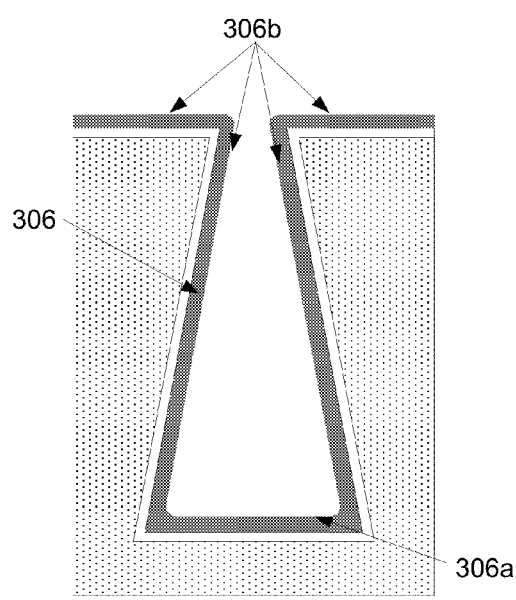

FIG. 3C is a schematic illustration of a cobalt seed layer 306 partially filled in small feature 300 over the barrier layer 304. Note that the cobalt seed layer 306 is also conformal. The small feature 300 is partially filled such that fill of the feature 300 is terminated when the opening at the top of the feature is sufficiently small to allow some plasma to enter in subsequent processing, and is small enough to prevent plasma from entering into the majority of the sidewalls in the feature. The remaining opening at the top of the feature is prepared to allow plasma to enter in subsequent processing, but to limit plasma exposure to the top about 10-30% of the sidewalls of the deposited cobalt indicated by 306b, which is discussed in detail below.

If the feature is a large feature, such as a feature having an initial opening greater than about 3×nm, or greater than about 1×nm, then the partial fill is stopped at a predetermined time even if the remaining opening on the feature is not small enough to prevent plasma from entering into the majority of the sidewalls in the feature.

Figure 4A:
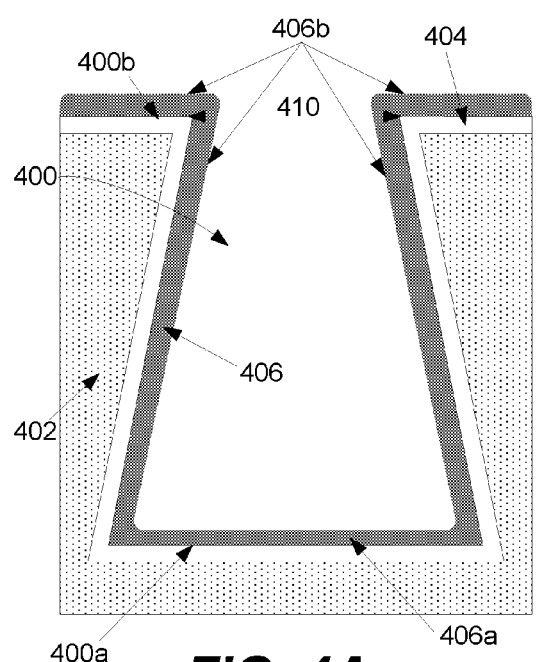
FIGS. 4A-4H are schematic illustrations of features filled with cobalt in accordance with disclosed embodiments.

FIG. 4A is a schematic illustration of an example of a large feature 400 in a substrate 402. The large feature 400 has a feature opening 410, which may be on the order of greater than about 2×nm or about 3×nm. The large feature 400 includes an optional barrier film 404 which was deposited conformally in accordance with operation 204 described above with respect to FIG. 2. A cobalt seed layer 406 is deposited conformally over the substrate per operation 206 with respect to FIG. 2, and the predetermined time for terminating cobalt seed layer deposition depends on the feature size.

Returning to FIG. 2, in operation 208, the cobalt surfaces at and near the top of the feature are treated by exposing to a plasma generated from a nitrogen-containing gas. This treatment may be referred to as "inhibitor controlled exposure" (ICE) or "plasma-based surface nitridation." In various embodiments, the plasma is a directional plasma such that the active species from the plasma directly contact the surfaces of the feature in a direction perpendicular to the plane of the substrate. In some embodiments, treated surfaces may form cobalt nitride ($CoN_x$), which triggers a long nucleation delay in subsequent processing. A treated barrier film, such as one from treated in operation 204b may have a nucleation delay shorter than the nucleation delay on a treated cobalt film. The following description describes treated cobalt surfaces but it should be understood that any of the following treatment processes and conditions may be used to treat barrier films and form treated barrier film, such as in operation 204b.

Since various features may have an opening narrower than the width of the bottom of the feature, the plasma treats mostly the top surfaces of the feature and the top about 10% to about 50% of the feature sidewalls. In some embodiments, the plasma treats the top about 10% to about 30% of the feature sidewalls. In various embodiments involving a small feature, due to the narrow opening, the bottom about 50% to 90% of the sidewalls remains untreated. In some embodiments, the bottom about 70% to 90% of the sidewalls remains untreated. In some embodiments, when the active species hits the feature opening, nitrogen ions collide around the opening, leaving a small gradient of treated cobalt surfaces near the top of the feature. Since treated surfaces exhibit a longer nucleation delay, cobalt nucleation is selectively inhibited on the treated surfaces such that there is a differential inhibition profile along a feature axis formed by the treatment. Selective inhibition, which may also be referred to as selective passivation, differential inhibition, or differential passivation, involves inhibiting subsequent cobalt nucleation on a portion of the feature, while not inhibiting nucleation (or inhibiting nucleation to a lesser extent) on the remainder of the feature. For example, in some embodiments, a feature is selectively inhibited at or near a feature opening (e.g., the top about 10% to about 50%, or about 10% to about 30% of the feature sidewalls and the top surfaces of the feature), while nucleation in the bottom about 70% to 90%, or about 50% to 90% of the sidewalls inside the feature is not inhibited.

Figure 3D:
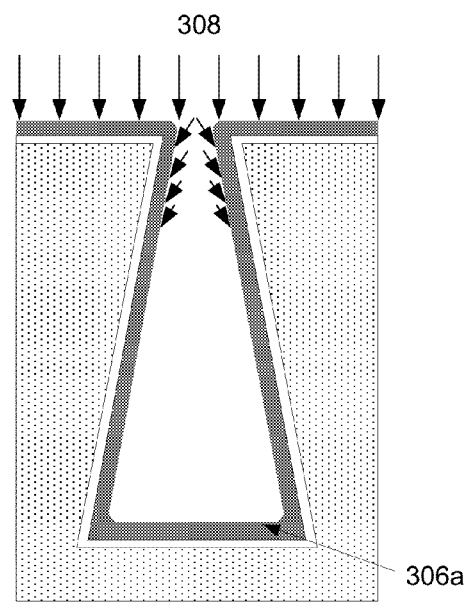

FIG. 3D is a schematic illustration of nitrogen ions 308 generated from plasma directed at the surfaces of the deposited cobalt 306. Note that the surfaces of cobalt at the top of the feature 306b are exposed to the nitrogen ions 308, while the surfaces of cobalt at the bottom of the feature 306a are not exposed to nitrogen ions. This is due to the narrower opening at the top of the feature 300, such that the nitrogen ions hit the top about 10-50% of the sidewalls, forming a differential inhibition profile of treated cobalt surfaces 306b. Note that the arrows on the sidewalls are depicted to show the collision of nitrogen ions around the opening of the feature.

In embodiments where a large feature is filled with cobalt, the nitrogen ions enter the entire feature and may treat some of the bottom of the feature and bottom portions of the sidewalls. However, due to the shape of the feature, the top portion of the feature sidewalls may be treated with more nitrogen ions than the bottom sidewalls of the feature.

Figure 4B:
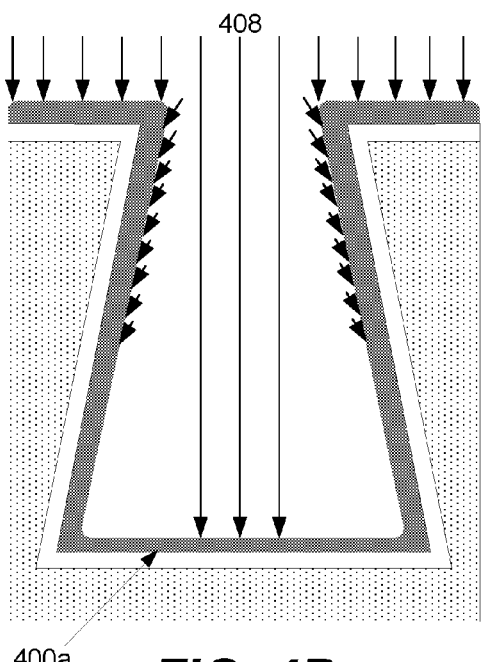

FIG. 4B is a schematic illustration of a larger feature 400 with a cobalt seed layer 406 exposed to a plasma and nitrogen ions 408. Note that as compared to FIG. 3D, the bottom of the feature 400a is also exposed to the plasma due to the wider opening. However, since the surface is further away from the plasma 308, the surface at the bottom 400a may not be exposed to as much plasma 308 as the surfaces at the sidewalls and the top of the feature.

The treatment performed in operation 208 may be performed at a temperature less than about 400° C., or between about 50° C. and about 200° C., or between about 70° C. and about 200° C. The chamber pressure may be less than about 10 Torr, or between about 0.1 Torr and about 5 Torr, or between about 0.5 Torr and about 2 Torr. The plasma used may be a directional in-situ plasma with a bias. Typically though not necessarily, such a plasma is capacitively-coupled. Alternatively, it may be inductively-coupled. The plasma power for a single station may be between about 50 W and about 5000 W, or 100 W and about 1000 W, or between about 100 W and about 500 W, or between about 200 W and about 500 W. The gas introduced to the chamber for generating the plasma may be any nitrogen-containing gas or mixture of nitrogen-containing gases. In various embodiments, the gas used is nitrogen. The gas flow rate may be between about 50 sccm and about 5000 sccm, or between about 100 sccm and about 2000 sccm, or between about 100 sccm and about 500 sccm, or between about 200 sccm and about 500 sccm. Operation 208 may be performed for an exposure time less than about 300 seconds, or between about 1 second and about 300 seconds, or between about 5 seconds and about 60 seconds. In some embodiments, exposure time may be between about 2 seconds and about 60 seconds, or between about 5 seconds and about 20 seconds.

Returning to FIG. 2, if in operation 210, it is determined that the remaining feature opening is not sufficiently small (e.g., if the feature being filled is a large feature having a feature opening greater than 3×nm, for example), such that the bottom of the feature was exposed to plasma in operation 208, or the opening of the feature is not sufficiently narrowed such that only the top 10-50% of the sidewalls of cobalt are treated in operation 208, then the operations 206 and 208 may be repeated as shown in operation 207 until a sufficient thickness of partially filled cobalt seed layer is formed in the substrate.

Figure 4C:
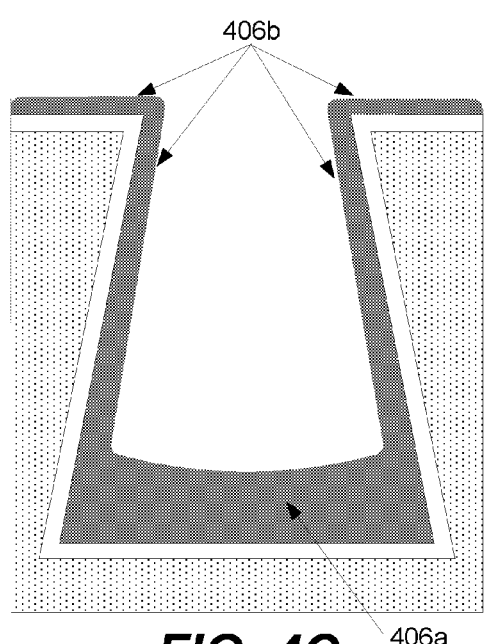
Figure 4D:
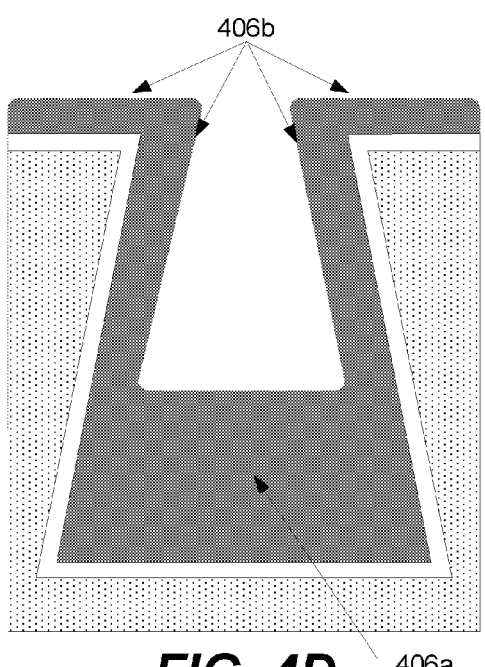

FIGS. 4C-4H are schematic illustrations of depositing a large feature with cobalt by repeating operations 206 and 208 over time. In FIG. 4C, cobalt is introduced to the chamber to continue to form cobalt. Note, however, that although more cobalt is formed at the bottom of the feature at 406a, since much of the cobalt surface was treated, there is also cobalt growth at 406b. The nucleation delay experienced at 406b may not be much higher than the little to no nucleation delay at 406a. In FIG. 4D, cobalt is further deposited such that cobalt around the top of the feature 406b is growing at the same or similar rate as the cobalt at the bottom of the feature 406a. FIGS. 4C and 4D depict growth of cobalt over time while operation 206 is performed to partially fill the feature with cobalt at low temperature again. Any of the above conditions and methods described with respect to operation 206 may be used to perform the repeated operation.

Figure 4E:
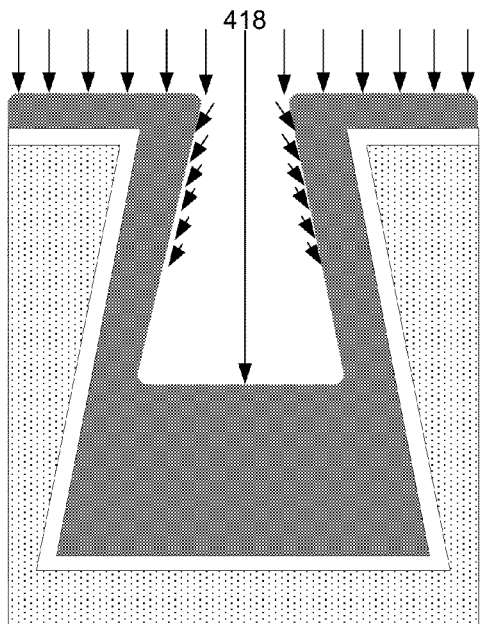

After a predetermined time, the top surfaces of the feature 406b are treated in operation 208 by exposing the substrate to a plasma generated from a nitrogen-containing gas. FIG. 4E show a schematic illustration of the subsequent treatment. Note that the nitrogen ions 418 now primarily treat the top surfaces 406b of the feature, much like the illustration in FIG. 3D. This ensures that subsequent deposition using the cobalt-containing precursor will be selective and nucleation delay on the treated surfaces will be higher than the nucleation delay on the untreated surfaces.

Returning to FIG. 2, in operation 210, the remaining opening (e.g., the remaining space between the deposited cobalt films at the top of the feature) is evaluated. If the remaining opening is sufficiently small such that the bottom of the feature was not exposed to the plasma during operation 208, then bulk fill of cobalt is deposited into the feature per operation 212. In some embodiments, this is performed using CVD cobalt gap fill methods. The substrate is exposed to a cobalt-containing precursor and a reducing agent to form cobalt on the surface of deposited cobalt.

The temperature during CVD cobalt gap fill may be between about 70° C. and about 400° C., or between about 70° C. and about 200° C. In some embodiments, the temperature may be between about 70° C. and about 200° C., or between about 70° C. and about 90° C. The chamber pressure may be between about 0.1 Torr and about 10 Torr, or between about 1 Torr and about 5 Torr. In some embodiments, the pressure may be between about 0.5 Torr and about 10 Torr, or between about 1 Torr and about 3 Torr. The cobalt-containing precursor and/or reducing agent may be introduced using a carrier gas, such as Ar, $N_2$, or CO, which may have a flow rate between about 10 sccm and about 300 sccm or between about 10 sccm and about 50 sccm. In some embodiments, the flow rate is between about 10 sccm and about 100 sccm, or between about 10 sccm and about 30 sccm. In some embodiments, the cobalt-containing precursor and/or reducing agent are introduced with Ar as a carrier gas. The reducing agent may be $H_2$, flowing at a flow rate between about 100 sccm and about 5000 sccm, or between about 2000 sccm and about 5000 sccm. The process time and thickness of operation 210 depends on the size of the feature.

Figure 3E:
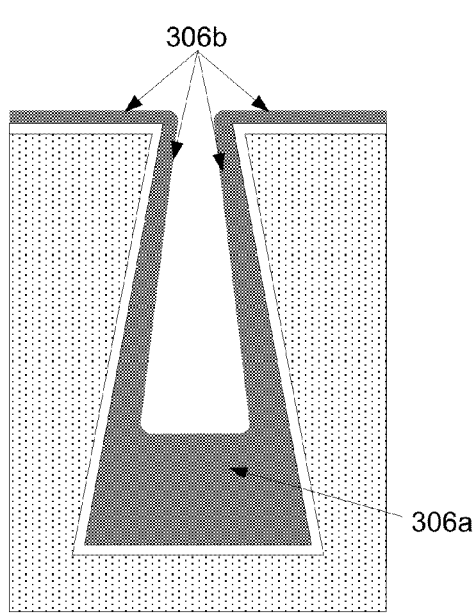
Figure 3F:
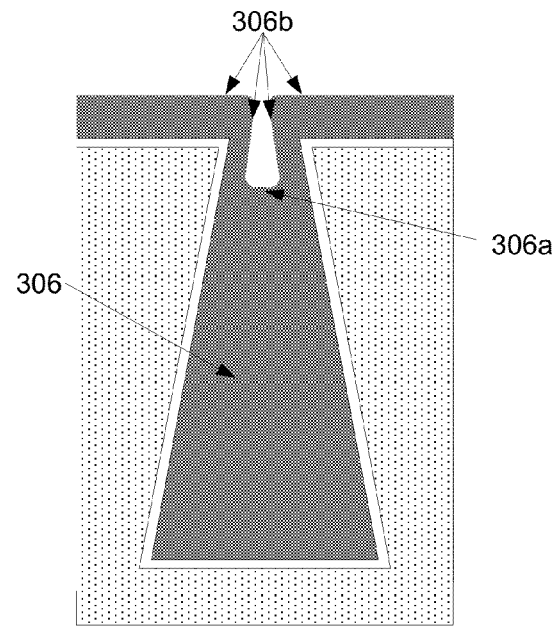
Figure 3G:
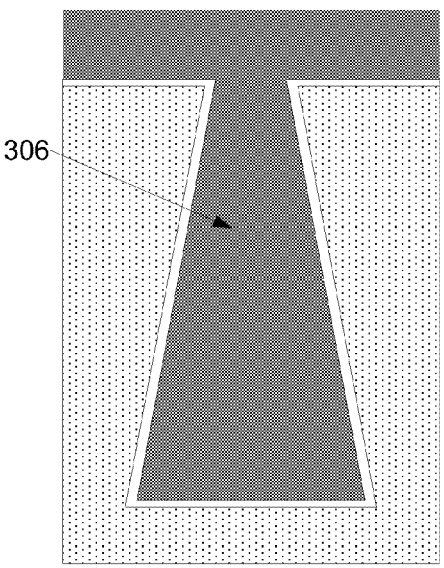

FIGS. 3E-3G show schematic illustrations of the gap fill process over time in a small feature. In FIG. 3E, it was determined in operation 210 that the remaining opening was sufficiently small, and operations 206 and 208 were not repeated. Bulk cobalt fill was subsequently deposited per operation 212. As shown, in FIG. 3E, since the top surfaces 306b were treated, these surfaces are passivated such that when cobalt is deposited on the substrate, these surfaces have a longer nucleation delay than compared to the bottom surfaces that were not treated. The nucleation delay for a treated surface may be greater than about 200 seconds. The time of nucleation for a non-treated surface versus a treated surface depends on the treatment exposure time. The time of nucleation can be evaluated by comparing the thickness of cobalt on a non-treated surface versus a treated surface over time. For example, treated surfaces may have a nucleation delay such that over about 300 seconds, the non-treated surfaces may have about 17 to 18 nm more cobalt deposited than the treated surfaces for a treatment exposure time of about 20 seconds. Void-free gap cobalt gap fill is made possible by high selective film growth between treated and non-treated cobalt layers. Thus, the growth of cobalt in FIG. 3E is mostly bottom up such that cobalt deposited at the bottom of the feature 306a continues to grow. In FIG. 3F, note that the surfaces at 306b have nucleated by the time the cobalt at 306a has filled most of the feature. In FIG. 3G, the cobalt fill is complete such that the feature is filled with void-free cobalt 306.

Figure 4F:
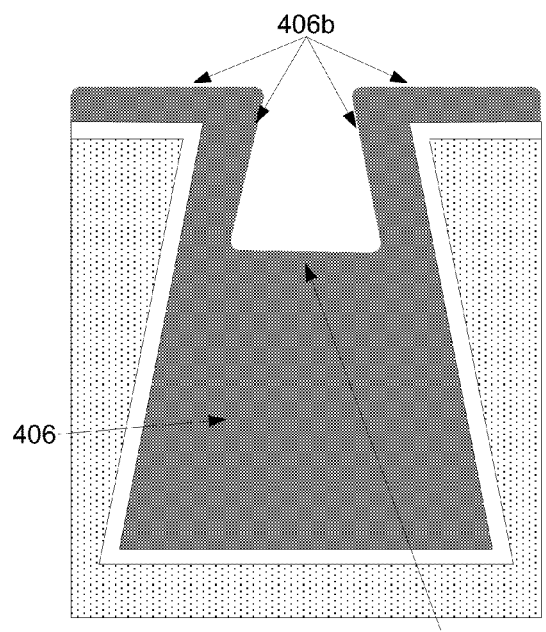
Figure 4G:
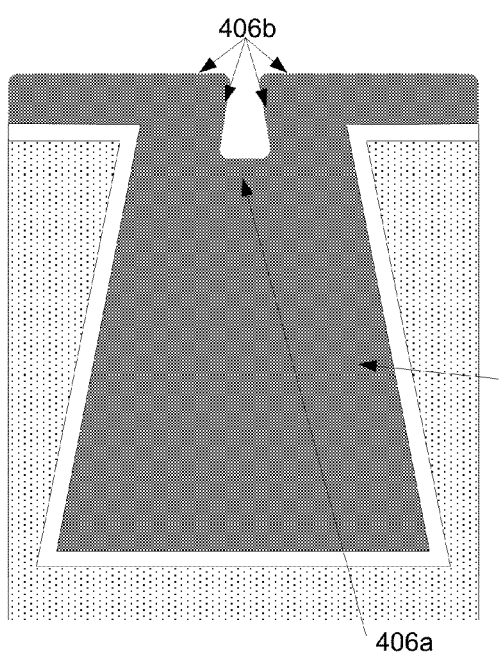
Figure 4H:
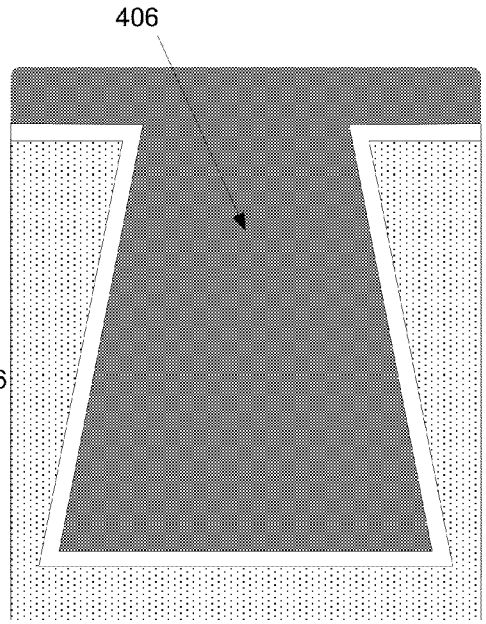

In FIG. 4F, it is determined in operation 210, after repeating operations 206 and 208 as described above, that the remaining opening is sufficiently small. Operation 212 is performed such that CVD cobalt gap fill occurs. As described, in some embodiments, such as if the feature opening is very small, after the barrier film is treated in operation 204b, a bulk cobalt layer is deposited in operation 212 without deposition of a cobalt seed layer. Nonetheless, as shown in FIG. 4F, as bulk cobalt is deposited, the surfaces at the top 406b have a higher nucleation delay and therefore little growth is shown, while growth of bulk cobalt 406 is shown at the bottom surface of the cobalt 406a. In FIG. 4G, cobalt nucleates at the top of the feature 406b, but the bottom surface of the cobalt 406a has already filled most of the feature. FIG. 4H provides a schematic illustration of the void-free cobalt 406 deposited in a large feature using cycles of treatment and deposition.

Apparatus

Deposition techniques provided herein may be implemented in a plasma enhanced chemical vapor deposition (PECVD) chamber or a conformal film deposition (CFD) chamber or in some embodiments, an ALD chamber. Such a chamber may take many forms, and may be part of an apparatus that includes one or more chambers or reactors (sometimes including multiple stations) that may each house one or more substrate or wafers and may be configured to perform various substrate processing operations. The one or more chambers may maintain the substrate in a defined position or positions (with or without motion within that position, e.g., rotation, vibration, or other agitation). In one implementation, a substrate undergoing film deposition may be transferred from one station to another within a chamber during the process. In other implementations, the substrate may be transferred from chamber to chamber within the apparatus to perform different operations, such as etching operations or lithography operations. The full film deposition may occur entirely at a single station or any fraction of the total film thickness for any deposition step. While in process, each substrate may be held in place by a pedestal, substrate chuck, and/or other substrate-holding apparatus. For certain operations in which the substrate is to be heated, the apparatus may include a heater, such as a heating plate.

Figure 5:
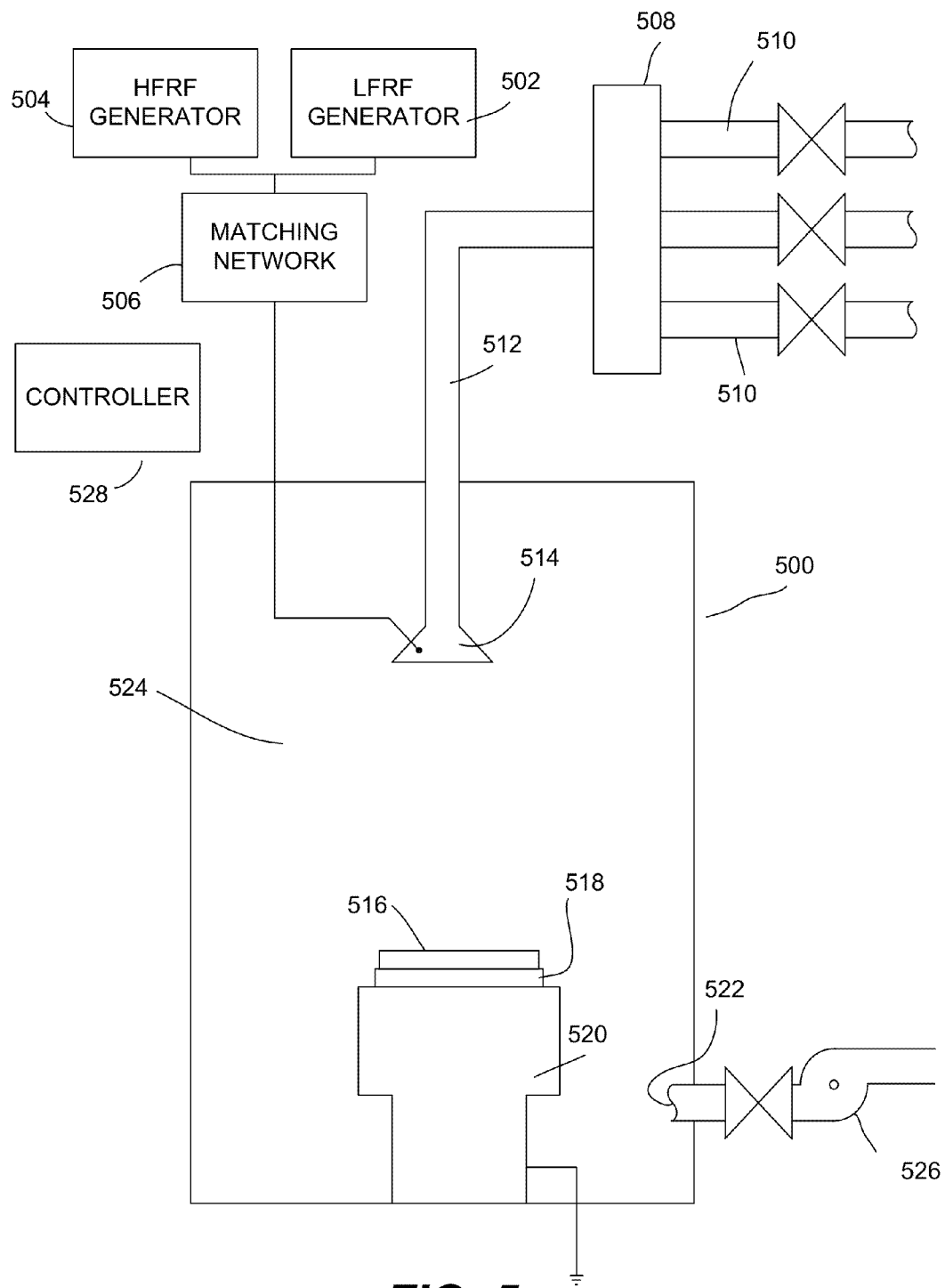
FIG. 5 is a schematic illustration of a processing chamber suitable for deposition and/or plasma treatment processes in accordance with disclosed embodiments.

FIG. 5 provides a simple block diagram depicting various reactor components arranged for implementing methods described herein. As shown, a reactor 500 includes a process chamber 524 that encloses other components of the reactor and serves to contain a plasma generated by a capacitive-discharge type system including a showerhead 514 working in conjunction with a grounded heater block 520. A high frequency (HF) radio frequency (RF) generator 504 and a low frequency (LF) RF generator 502 may be connected to a matching network 506 and to the showerhead 514. The power and frequency supplied by matching network 506 may be sufficient to generate a plasma from process gases supplied to the process chamber 524. For example, the matching network 506 may provide 100 W to 1000 W of power. In a typical process, the HFRF component may generally be between 1 MHz to 100 MHz, e.g., 13.56 MHz. In operations where there is an LF component, the LF component may be from less than about 1 MHz, e.g., 100 kHz.

Within the reactor, a pedestal 518 may support a substrate 516. The pedestal 518 may include a chuck, a fork, or lift pins (not shown) to hold and transfer the substrate during and between the deposition and/or plasma treatment reactions. The chuck may be an electrostatic chuck, a mechanical chuck, or various other types of chuck as are available for use in the industry and/or for research.

Various process gases may be introduced via inlet 512. Multiple source gas lines 510 are connected to manifold 508. The gases may be premixed or not. Appropriate valving and mass flow control mechanisms may be employed to ensure that the correct process gases are delivered during the deposition and plasma treatment phases of the process. In the case where a chemical precursor(s) is delivered in liquid form, liquid flow control mechanisms may be employed. Such liquids may then be vaporized and mixed with process gases during transportation in a manifold heated above the vaporization point of the chemical precursor supplied in liquid form before reaching the deposition chamber.

Process gases, such as a cobalt-containing precursor or nitrogen-containing gas, may exit chamber 524 via an outlet 522. A vacuum pump, e.g., a one or two stage mechanical dry pump and/or turbomolecular pump 540, may be used to draw process gases out of the process chamber 524 and to maintain a suitably low pressure within the process chamber 524 by using a closed-loop-controlled flow restriction device, such as a throttle valve or a pendulum valve.

Figure 6:
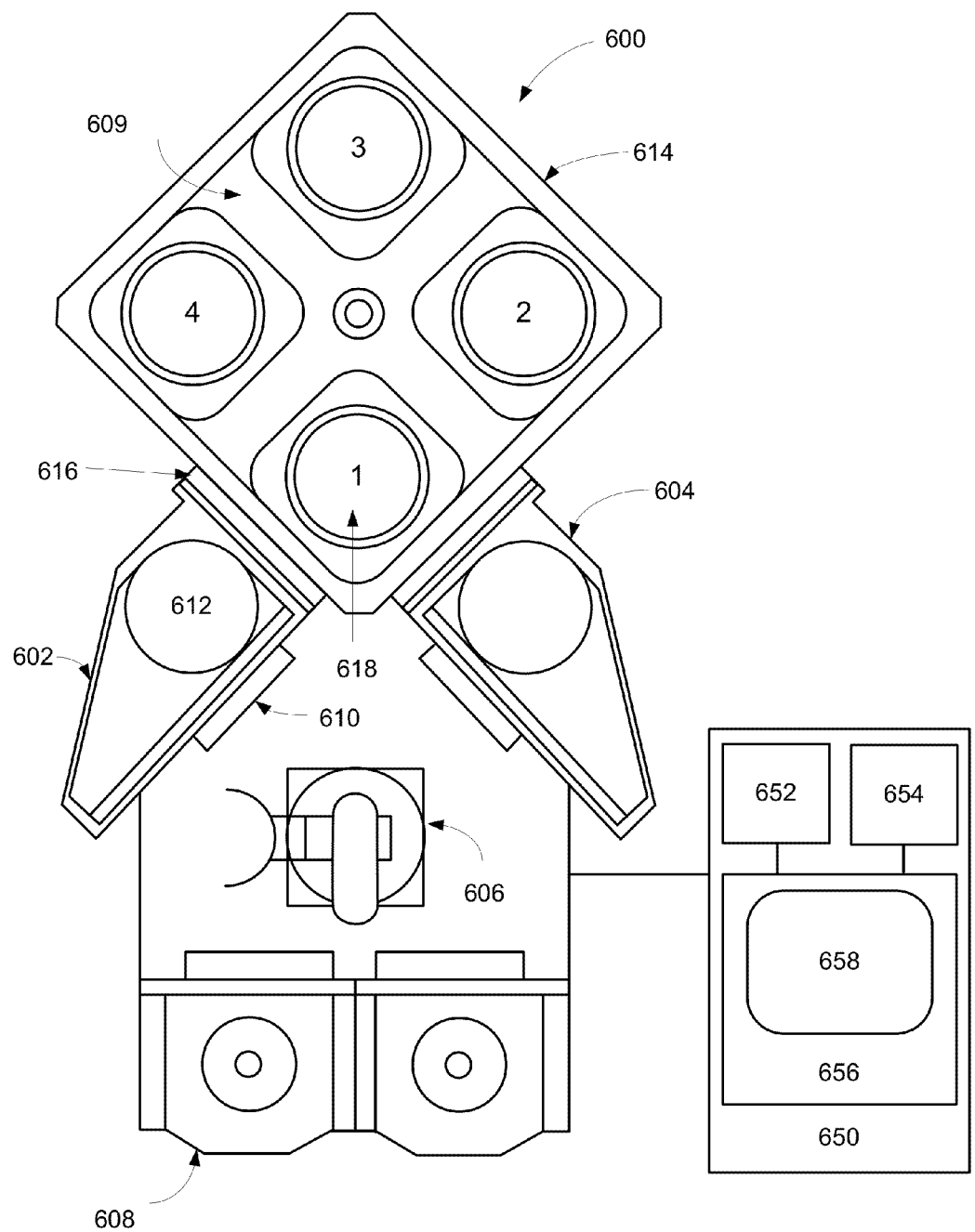
FIG. 6 is a schematic illustration of a processing apparatus suitable for deposition processes in accordance with disclosed embodiments.

As discussed above, the techniques for deposition discussed herein may be implemented on a multi-station or single station tool. FIG. 6 is a schematic illustration of an example of such a tool. In specific implementations, a 300 mm Lam Vector™ tool having a 4-station deposition scheme or a 200 mm Sequel™ tool having a 6-station deposition scheme may be used. In some implementations, tools for processing 450 mm substrates may be used. In various implementations, the substrates may be indexed after every deposition and/or post-deposition plasma treatment, or may be indexed after etching steps if the etching chambers or stations are also part of the same tool, or multiple depositions and treatments may be conducted at a single station before indexing the substrate.

In some embodiments, an apparatus may be provided that is configured to perform the techniques described herein. A suitable apparatus may include hardware for performing various process operations as well as a system controller 530 having instructions for controlling process operations in accordance with the disclosed embodiments. The system controller 530 will typically include one or more memory devices and one or more processors communicatively connected with various process control equipment, e.g., valves, RF generators, substrate handling systems, etc., and configured to execute the instructions so that the apparatus will perform a technique in accordance with the disclosed embodiments, e.g., a technique such as that provided in the deposition steps of FIG. 2. Machine-readable media containing instructions for controlling process operations in accordance with the present disclosure may be coupled to the system controller 530. The controller 530 may be communicatively connected with various hardware devices, e.g., mass flow controllers, valves, RF generators, vacuum pumps, etc. to facilitate control of the various process parameters that are associated with the deposition operations as described herein.

In some embodiments, a system controller 530 may control all of the activities of the reactor 500. The system controller 530 may execute system control software stored in a mass storage device, loaded into a memory device, and executed on a processor. The system control software may include instructions for controlling the timing of gas flows, substrate movement, RF generator activation, etc., as well as instructions for controlling the mixture of gases, the chamber and/or station pressure, the chamber and/or station temperature, the substrate temperature, the target power levels, the RF power levels, the substrate pedestal, chuck, and/or susceptor position, and other parameters of a particular process performed by the reactor apparatus 500. For example, the software may include instructions or code for controlling the flow rate of a cobalt-containing precursor, the flow rate of a reducing agent, the flow rate of a nitrogen-containing gas, and exposure times for each of the above described flow chemistries. The system control software may be configured in any suitable way. For example, various process tool component subroutines or control objects may be written to control operation of the process tool components necessary to carry out various process tool processes. The system control software may be coded in any suitable computer readable programming language.

The system controller 530 may typically include one or more memory devices and one or more processors configured to execute the instructions so that the apparatus will perform a technique in accordance with the present disclosure. Machine-readable media containing instructions for controlling process operations in accordance with disclosed embodiments may be coupled to the system controller 530.

As described above, one or more process stations may be included in a multi-station processing tool. FIG. 6 shows a schematic view of an embodiment of a multi-station processing tool 600 with an inbound load lock 602 and an outbound load lock 604, either or both of which may comprise a remote plasma source. A robot 606, at atmospheric pressure, is configured to move substrates from a cassette loaded through a pod 608 into inbound load lock 602 via an atmospheric port 610. A substrate is placed by the robot 606 on a pedestal 612 in the inbound load lock 602, the atmospheric port 610 is closed, and the load lock is pumped down. Where the inbound load lock 602 comprises a remote plasma source, the substrate may be exposed to a remote plasma treatment in the load lock prior to being introduced into a processing chamber 614. Further, the substrate also may be heated in the inbound load lock 602 as well, for example, to remove moisture and adsorbed gases. Next, a chamber transport port 616 to processing chamber 614 is opened, and another robot (not shown) places the substrate into the reactor on a pedestal of a first station shown in the reactor for processing. While the embodiment depicted in FIG. 6 includes load locks, it will be appreciated that, in some embodiments, direct entry of a substrate into a process station may be provided.

The depicted processing chamber 614 comprises four process stations, numbered from 1 to 4 in the embodiment shown in FIG. 6. Each station has a heated pedestal (shown at 618 for station 1), and gas line inlets. Some stations may include similar components to those described above with respect to FIG. 5. It will be appreciated that in some embodiments, each process station may have different or multiple purposes. For example, in some embodiments, a process station may be switchable between an ALD and CVD process mode. Additionally or alternatively, in some embodiments, processing chamber 614 may include one or more matched pairs of ALD and CVD process stations. In some embodiments, features may be partially filled with cobalt thermally (e.g., without a plasma) using ALD or CVD at one station (such as station 1). The substrate may then be transferred to a second station (such as station 2) within the same chamber 614, or to a station in a different chamber, where the substrate is exposed to a nitrogen-containing gas and plasma, followed by exposure to a cobalt-containing precursor and a reducing agent to deposit bulk cobalt by CVD. In some embodiments, the reducing agent alternates with plasma exposure while a nitrogen-containing gas flows into the chamber. The nitrogen-containing gas and/or the reducing agent may be introduced only to the station where the substrate of interest is (such as station 2), or it may be introduced to the entire chamber 614.

In various embodiments, the substrate is not transferred to a second station. Rather, the substrate remains in the same station as during the thermal deposition (e.g., station 1), but the station is equipped to also introduce a reducing agent, a nitrogen-containing gas, and plasma to the station after the thermal deposition.

In some embodiments, after the substrate undergoes thermal deposition of cobalt, the substrate is transferred to a different chamber, which may also include various stations. While the depicted processing chamber 614 comprises four stations, it will be understood that a processing chamber according to the present disclosure may have any suitable number of stations. For example, in some embodiments, a processing chamber may have five or more stations, while in other embodiments a processing chamber may have three or fewer stations.

FIG. 6 depicts an embodiment of a wafer handling system 609 for transferring wafers within processing chamber 614. In some embodiments, wafer handling system 609 may transfer wafers between various process stations and/or between a process station and a load lock. It will be appreciated that any suitable wafer handling system may be employed. Non-limiting examples include wafer carousels and wafer handling robots. FIG. 6 also depicts an embodiment of a system controller 650 employed to control process conditions and hardware states of process tool 600. System controller 650 may include one or more memory devices 656, one or more mass storage devices 654, and one or more processors 652. Processor 652 may include a CPU or computer, analog, and/or digital input/output connections, stepper motor controller boards, etc.

In some embodiments, the controller 650 controls all of the activities of process tool 600. The controller 650 executes system control software 658 stored in mass storage device 654, loaded into memory device 656, and executed on processor 652. Alternatively, the control logic may be hard coded in the controller 650. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 658 may include instructions for controlling the timing, mixture of gases, amount of sub-saturated gas flow, chamber and/or station pressure, chamber and/or station temperature, wafer temperature, target power levels, RF power levels, substrate pedestal, chuck and/or susceptor position, and other parameters of a particular process performed by process tool 600. System control software 658 may be configured in any suitable way. For example, various process tool component subroutines or control objects may be written to control operation of the process tool components necessary to carry out various process tool processes. System control software 658 may be coded in any suitable computer readable programming language.

In some embodiments, system control software 658 may include input/output control (IOC) sequencing instructions for controlling the various parameters described above. Other computer software and/or programs stored on mass storage device 654 and/or memory device 656 associated with the controller 650 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 618 and to control the spacing between the substrate and other parts of process tool 600.

A process gas control program may include code for controlling gas composition (e.g., cobalt-containing precursor, reducing agent, and nitrogen-containing gas as described herein) and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

In some implementations, a controller 650 is part of a system, which may be part of the above-described examples. Such systems can comprise semiconductor processing equipment, including a processing tool or tools, chamber or chambers such as chamber 614, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller 650, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller 650 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller 650 in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer. For example, parameters may include cobalt-containing precursor gas flow, reducing agent gas flow, carrier gas flow, nitrogen-containing gas flow, plasma power and frequency, pedestal temperature, station or chamber pressure and/or temperature, and others.

The controller 650, in some implementations, may be a part of or coupled to a computer that is integrated with, coupled to the system, otherwise networked to the system, or a combination thereof. For example, the controller 650 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller 650 receives instructions in the form of data, which specify parameters for each of the processing steps to be performed during one or more operations. It should be understood that the parameters may be specific to the type of process to be performed and the type of tool that the controller 650 is configured to interface with or control. Thus as described above, the controller 650 may be distributed, such as by comprising one or more discrete controllers that are networked together and working towards a common purpose, such as the processes and controls described herein. An example of a distributed controller 650 for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller 650 might communicate with one or more of other tool circuits or modules, other tool components, cluster tools such as tool 600, other tool interfaces, adjacent tools, neighboring tools, tools located throughout a factory, a main computer, another controller 650, or tools used in material transport that bring containers of wafers to and from tool locations and/or load ports in a semiconductor manufacturing factory.

A heater control program may include code for controlling the current to a heating unit that is used to heat the substrate. Alternatively, the heater control program may control delivery of a heat transfer gas (such as helium) to the substrate.

A plasma control program may include code for setting RF power levels applied to the process electrodes in one or more process stations in accordance with the embodiments herein.

A pressure control program may include code for maintaining the pressure in the reaction chamber in accordance with the embodiments herein.

In some embodiments, there may be a user interface associated with the controller 650. The user interface may include a display screen, graphical software displays of the apparatus and/or process conditions, and user input devices such as pointing devices, keyboards, touch screens, microphones, etc.

In some embodiments, parameters adjusted by the controller 650 may relate to process conditions. Non-limiting examples include process gas composition and flow rates, temperature, pressure, plasma conditions (such as RF bias power levels), pressure, temperature, etc. These parameters may be provided to the user in the form of a recipe, which may be entered utilizing the user interface.

Signals for monitoring the process may be provided by analog and/or digital input connections of the controller 650 from various process tool sensors. The signals for controlling the process may be output on the analog and digital output connections of process tool 600. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

The controller 650 may provide program instructions for implementing the above-described deposition processes. The program instructions may control a variety of process parameters, such as DC power level, RF bias power level, pressure, temperature, etc. The instructions may control the parameters to operate in-situ deposition of film stacks according to various embodiments described herein.

The controller will typically include one or more memory devices and one or more processors configured to execute the instructions so that the apparatus will perform a method in accordance with the present embodiments. Machine-readable media containing instructions for controlling process operations in accordance with the present embodiments may be coupled to the controller.

An appropriate apparatus for performing the methods disclosed herein is further discussed and described in U.S. patent application Ser. No. 13/084,399 (now U.S. Pat. No. 8,728,956), filed Apr. 11, 2011, and titled "PLASMA ACTIVATED CONFORMAL FILM DEPOSITION"; and Ser. No. 13/084,305, filed Apr. 11, 2011, and titled "SILICON NITRIDE FILMS AND METHODS," each of which is incorporated herein in its entireties.

The apparatus/process described herein may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

EXPERIMENTAL

Experiment 1

An experiment was conducted to compare nucleation delays for treated and untreated cobalt films. Blanket cobalt seed layers were deposited on two substrates. On one substrate, the surfaces were treated at a temperature of 80° C. to nitrogen and plasma for 20 seconds. The other substrate was not treated. Both substrates were then exposed to a cobalt-containing precursor and hydrogen in a cobalt CVD bulk deposition. The amount of cobalt formed on the cobalt seed layer was measured over time.

Figure 7:
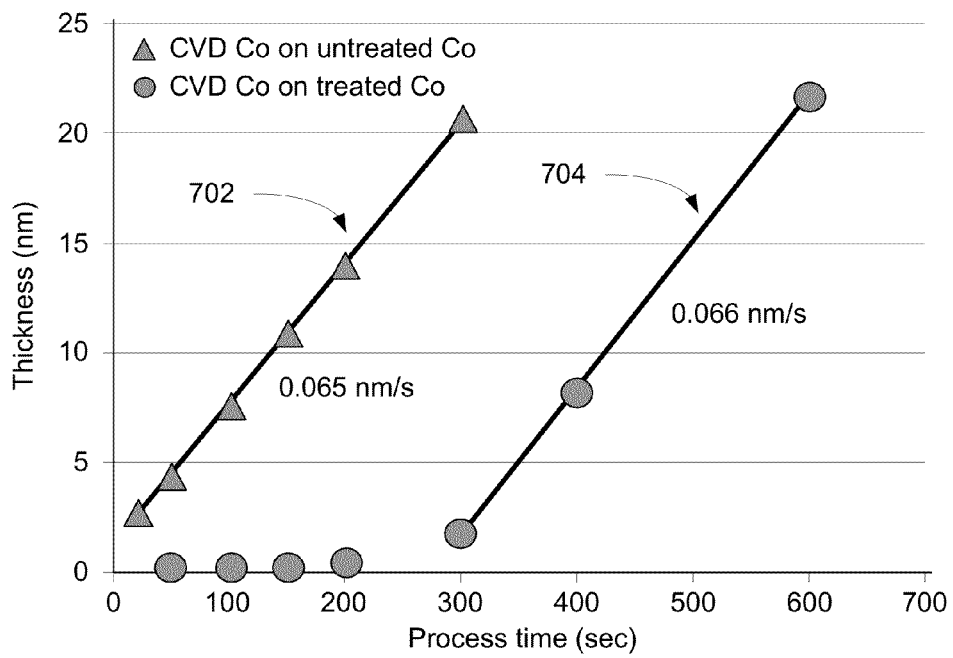
FIGS. 7 and 8 are plots depicting experimental results from depositing cobalt in accordance with disclosed embodiments.

FIG. 7 is a plot showing the various thicknesses of cobalt as deposited over time. Triangular plots 702 represent thicknesses measured for the untreated cobalt seed layer. Note the triangular plots show little to no nucleation delay. The circular plots 704 represent thicknesses measured for the treated cobalt seed layer. The nucleation delay was over about 200 seconds. Note that after the cobalt nucleates the deposition rate for both the untreated and treated substrates were similar (0.065 nm/s for untreated cobalt, and 0.066 nm/s for treated cobalt). These results suggest exposing a cobalt film to nitrogen and plasma may increase nucleation delay such that features may be filled with cobalt by delaying nucleation at or near the top of the feature to reduce voids.

Experiment 2

Figure 8:
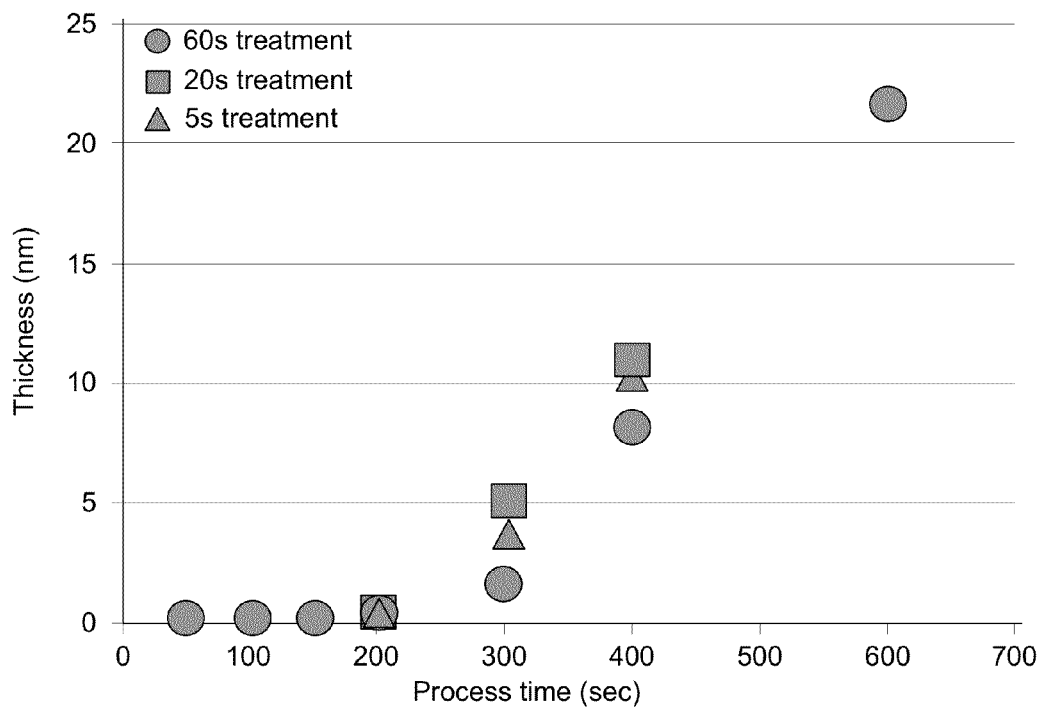

An experiment was conducted to compare the treatment exposure times on cobalt films. Three trials were performed, each on a blanket layer of cobalt film deposited in accordance with the methods described above in operation 202 of FIG. 2. The cobalt was exposed to nitrogen and plasma for 5 seconds, 20 seconds, and 60 seconds, each at 80° C. The substrates were subsequently exposed to a cobalt-containing precursor and hydrogen to deposit a bulk cobalt layer by CVD. Thicknesses of the newly deposited cobalt on the treated surfaces were measured and the results are plotted in FIG. 8. The thickness of cobalt deposited after a 5-second treatment is shown with triangular plots, 20-second treatment with square plots, and 60-second treatment with circular plots.

As shown, the treated films saturate at around 5 seconds, which indicates that the treatment effectively generates the treated surface (e.g., cobalt nitride surface) that may be used to retard the cobalt film nucleation at a short time.

Experiment 3

Figure 9A:
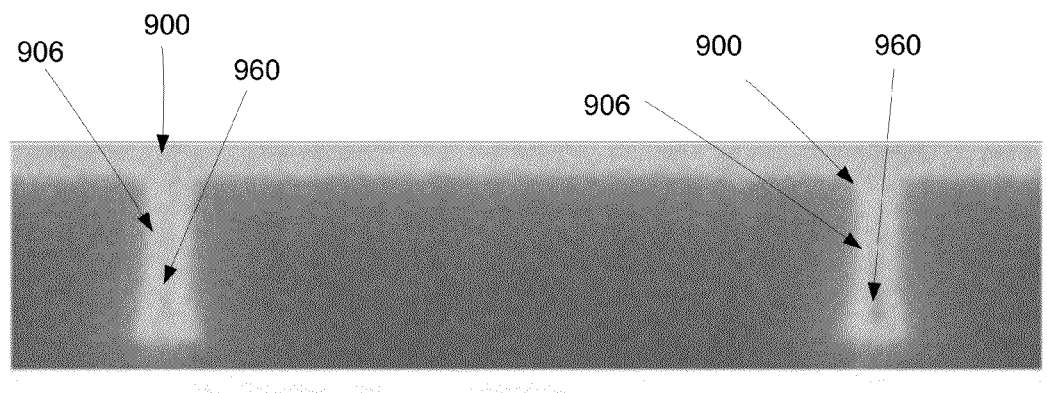
FIG. 9A is a SEM image of features filled with cobalt.
Figure 9B:
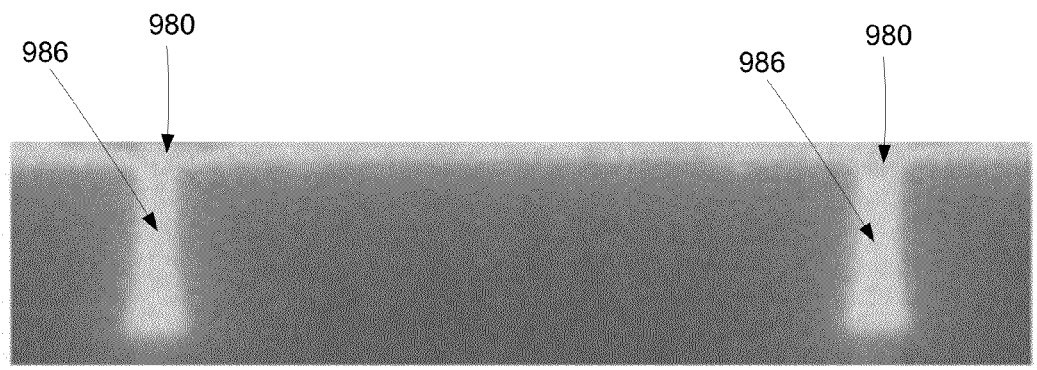
FIG. 9B is a SEM image of features filled with cobalt in accordance with disclosed embodiments.

An experiment was conducted to compare features deposited with cobalt using methods described herein. Each substrate included features with re-entrant features. One substrate was deposited using the method described above with respect to FIG. 2. The second substrate was deposited with cobalt without treatment—the cobalt seed layer was first deposited, followed by CVD bulk fill of cobalt. SEM images of the deposited films are shown in FIGS. 9A and 9B. FIG. 9A shows features deposited without the treatment. Note features 900 included deposited cobalt 906, but a void 960 formed in both features. FIG. 9B shows features deposited with the treatment. The features 980 are filled with cobalt 986 with no voids.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method comprising:
   (a) providing a substrate having one or more features, each feature comprising a feature opening;
   (b) selectively inhibiting cobalt nucleation on surfaces of the one or more features that are at or near the feature openings such that there is a differential inhibition profile in each feature; and
   (c) depositing cobalt in the one or more features in accordance with the differential inhibition profile.

2. The method of claim 1, further comprising prior to selectively inhibiting cobalt nucleation, depositing a barrier layer on the one or more features.

3. The method of claim 2, wherein the barrier layer is selected from the group consisting of titanium, titanium nitride, tungsten, tungsten nitride, tantalum, tantalum nitride, ruthenium, and cobalt nitride.

4. The method of claim 1, further comprising prior to selectively inhibiting cobalt nucleation, exposing the substrate to a cobalt-containing precursor to partially fill the one or more features.

5. The method of claim 1, wherein the method is performed at a temperature less than about 400° C.

6. The method of claim 4, wherein the cobalt-containing precursor is selected from the group consisting of dicarbonyl cyclopentadienyl cobalt, cobalt carbonyl, various cobalt amidinate precursors, cobalt diazadienyl complexes, cobalt amidinate/guanidinate precursors, and combinations thereof.

7. The method of claim 1, wherein the surfaces of the one or more features that are at or near the feature openings comprise the top about 10% to about 50% of the sidewalls of the one or more features.

8. The method of claim 1, wherein selectively inhibiting cobalt nucleation further comprises exposing the substrate to plasma generated from nitrogen-containing gas.

9. The method of claim 8, wherein the substrate is exposed to the plasma generated from the nitrogen-containing gas for a time less than about 300 seconds.

10. The method of claim 8, wherein the plasma is directional.

11. The method of claim 1, wherein the one or more features comprise re-entrant profiles.

12. The method of claim 1, wherein depositing cobalt in (c) comprises exposing the substrate to a cobalt-containing precursor and a reducing agent.

13. The method of claim 1, wherein (c) is performed by chemical vapor deposition.

14. The method of claim 1, wherein at least one of the feature openings is less than about 39 nm and at least one feature aspect ratio is at least about 1.5:1.

15. A method comprising:
(a) providing a substrate including one or more features, each feature comprising a feature opening;
(b) exposing the substrate to a cobalt-containing precursor to partially fill the one or more features;
(c) exposing the substrate to a nitrogen-containing gas and a plasma;
(d) optionally repeating (b) and (c); and
(e) depositing cobalt in the one or more features in accordance with a differential inhibition profile.

16. The method of claim 15, wherein the method is performed at a temperature less than about 400° C.

17. The method of claim 15, wherein the cobalt-containing precursor is selected from the group consisting of dicarbonyl cyclopentadienyl cobalt, cobalt carbonyl, various cobalt amidinate precursors, cobalt diazadienyl complexes, cobalt amidinate/guanidinate precursors, and combinations thereof.

18. The method of claim 15, wherein the surfaces of the one or more features that are at or near the feature openings comprise the top about 10% to about 50% of the sidewalls of the one or more features.

* * * * *